(12) United States Patent
Suzuki et al.

(10) Patent No.: US 9,509,209 B2
(45) Date of Patent: Nov. 29, 2016

(54) DRIVE UNIT FOR SWITCHING ELEMENT

(71) Applicant: DENSO CORPORATION, Kariya, Aichi-pref. (JP)

(72) Inventors: Tomotaka Suzuki, Nagoya (JP); Yoshiyuki Hamanaka, Kariya (JP)

(73) Assignee: Denso Corporation, Kariya (JP)

( * ) Notice: Subject to any disclaimer, the term of this patent is extended or adjusted under 35 U.S.C. 154(b) by 130 days.

(21) Appl. No.: 14/249,515

(22) Filed: Apr. 10, 2014

(65) Prior Publication Data

US 2014/0307492 A1 Oct. 16, 2014

(30) Foreign Application Priority Data

Apr. 15, 2013 (JP) .................................. 2013-085237

(51) Int. Cl.
| | |
|---|---|
| *H02M 1/32* | (2007.01) |
| *H02M 1/08* | (2006.01) |
| *H03K 17/082* | (2006.01) |
| *H03K 17/16* | (2006.01) |
| *H02M 7/5387* | (2007.01) |

(52) U.S. Cl.
CPC .............. *H02M 1/32* (2013.01); *H02M 1/08* (2013.01); *H03K 17/0828* (2013.01); *H03K 17/163* (2013.01); *H03K 17/168* (2013.01); *H02M 7/5387* (2013.01)

(58) Field of Classification Search
CPC ...... H02M 1/08; H02M 1/32; H02M 7/5387; H03K 17/0828; H03K 17/163; H03K 17/168
See application file for complete search history.

(56) References Cited

U.S. PATENT DOCUMENTS

| | | | | |
|---|---|---|---|---|
| 7,031,172 | B2* | 4/2006 | Tanaka ..................... | H02M 1/32 363/56.03 |
| 2009/0256618 | A1 | 10/2009 | Yamawaki et al. | |
| 2013/0094114 | A1* | 4/2013 | Shimizu ............... | H03K 17/567 361/87 |
| 2014/0111171 | A1* | 4/2014 | Kosugi ................... | H02M 1/32 323/271 |
| 2014/0277802 | A1* | 9/2014 | Tomas ...................... | H02J 4/00 700/292 |

FOREIGN PATENT DOCUMENTS

| | | |
|---|---|---|
| JP | 3367699 | 11/2002 |
| JP | 2002-369495 | 12/2002 |
| JP | 2008-066877 | 3/2008 |
| JP | 2010-062934 | 3/2010 |

OTHER PUBLICATIONS

Office Action (2 pages) dated Mar. 17, 2015, issued in corresponding Japanese Application No. 2013-085237 and English translation (3 pages).

* cited by examiner

*Primary Examiner* — Matthew Nguyen
(74) *Attorney, Agent, or Firm* — Nixon & Vanderhye PC

(57) ABSTRACT

An inverter for driving a motor generator has series connection units, each of which has two switching elements, connected in series, in high and low voltage sides, respectively. A drive unit is arranged for each switching element. A gate of the switching element is connected to an emitter thereof through a first cutoff resistance and a first cutoff switching element in the drive unit. The gate of the switching element is also connected to the emitter thereof through a second cutoff resistance and a second cutoff switching element in the drive unit. A resistance value of the first cutoff resistance is higher than a resistance value of the second cutoff resistance. A software cutoff process is performed when the switching element is in a completely turned-on state so that the first cutoff switching element is turned on and the second cutoff switching element is turned off.

9 Claims, 11 Drawing Sheets

⟨TYPE 1 SHORT CIRCUIT⟩

⟨TYPE 2 SHORT CIRCUIT⟩

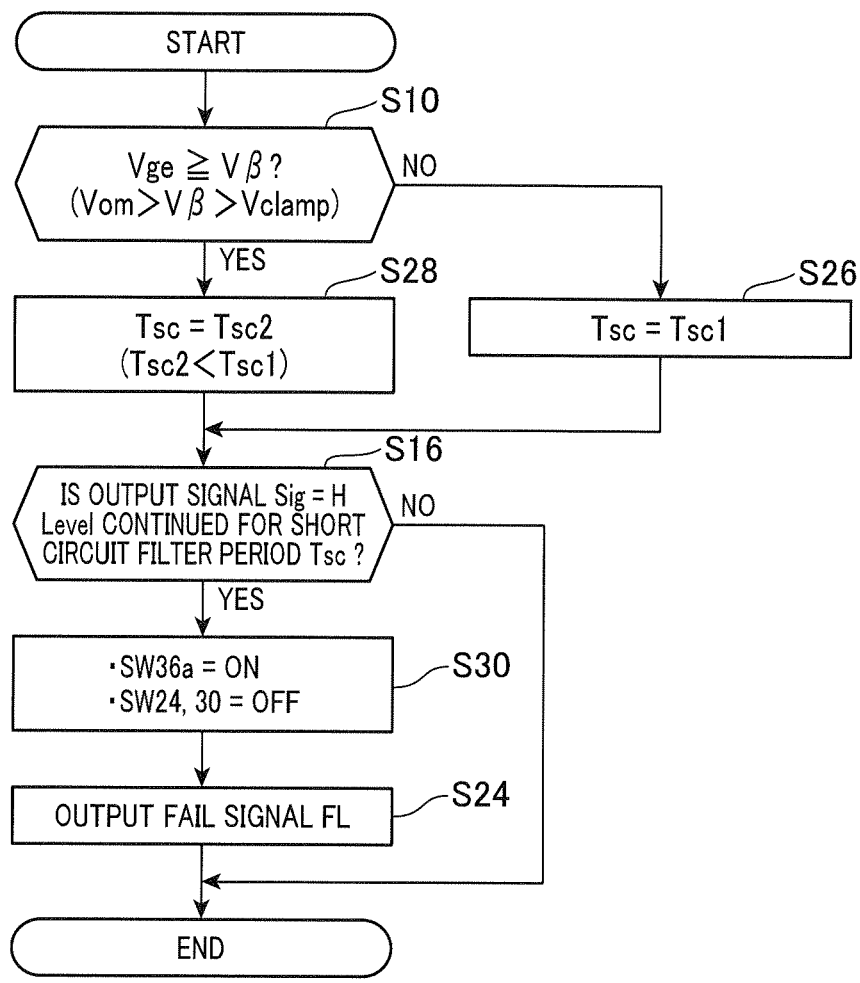

DRIVE UNIT FOR SWITCHING ELEMENT

CROSS-REFERENCE TO RELATED APPLICATION

This application is related to and claims priority from Japanese Patent Application No. 2013-85237 filed on Apr. 15, 2013, the contents of which are hereby incorporated by reference.

BACKGROUND OF THE INVENTION

1. Field of the Invention

The present invention relates to drive units having an overcurrent protection function for driving switching elements in an inverter, for example to be applied to motor generators, etc.

2. Description of the Related Art

There is a known technique, for example, patent document 1, Japanese patent No. 3367699, which has disclosed a conventional drive unit capable of driving a semiconductor switching element, for example composed of Insulated Gate Bipolar Transistors (IGBTs). The drive unit has an overcurrent protection function capable of decreasing a gate voltage of the semiconductor switching element when a collector current, which flows between an input terminal (the collector terminal) and an output terminal (the emitter terminal) of the semiconductor switching element, exceeds a threshold value. This operation forcedly cuts off the collector current.

However, when such an overcurrent protection function is applied to a drive unit in an electric power conversion circuit such as a three phase inverter, there is a possibility of causing the following drawback. In this case, the three phase inverter is equipped with series connection units. Each of the series connection units is comprised of a switching element in a high voltage side and a switching element in a low voltage side.

For example, under a condition in which one of the switching element in a high voltage side and the switching element in a low voltage side in each of the series connection units enters a completely turned-on state (or a full turned-on state), and an upper-lower arm short circuit occurs, in which the other switching element, which is not turned on, suffers a short circuit defect, when an overcurrent protection function forcedly cuts off the collector current flowing between the input terminal and the output terminal of the semiconductor switching element, this has a possibility of generating a large surge voltage. Such a large surge voltage often deteriorates the operational reliability of the switching element in a high voltage side and the switching element in a low voltage side.

SUMMARY

It is therefore desired to provide a drive unit for driving a switching element, as a target object to be driven or controlled, with a high operational reliability.

An exemplary embodiment provides a drive unit which drives a switching element. The drive unit has a current detection section, a turning-off section and a processing section.

The current detection section detects a current flowing in an input terminal and an output terminal of a target switching element to be driven and controlled. The turning-off section forcedly turns off the target switching element when the current detected by the current detection section exceeds a threshold value. The processing section controls a switching operation performed by the turning-off section for setting the target switching element to a forcedly turned-off state so that a magnitude to suppress a surge voltage generated in a case A1 becomes larger than a magnitude to suppress a surge voltage generated in a case A2. In the case A1, the surge voltage is generated in the target switching element when the target switching element is forcedly turned off by the turning-off section when the current detected by the current detection section exceeds the threshold value under a completely turned-on state (or a fully turned-off state) of the target switching element. In the case A2, a surge voltage is generated in the target switching element when the target switching element is forcedly turned off by the turning-off section under an incompletely turned-on state (or a half turned-off state) of the target switching element.

In general, an overcurrent which flows in the target switching element in the completely turned-on state of the target switching element is larger than an overcurrent which flows in the target switching element in the incompletely turned-on state of the target switching element. Further, the more the overcurrent flowing in the target switching element increases when the target switching element is forcedly turned off by the forced cutoff section, the more a surge voltage generated when the target switching element is forcedly turned off increases. Accordingly, in a case in which the target switching element is in the completely turned-on state and an overcurrent flows in the target switching element, the surge current is excessively increased when the target switching element is forcedly turned off. This deteriorates the operational reliability of the target switching element.

In order to avoid the above drawback, the drive unit according to an exemplary embodiment of the present invention has the processing section. The processing section suppresses a magnitude of the surge current generated when the target switching element is forcedly turned off even if the overcurrent flows in the target switching element under the complete turned-on state of the target switching element. This makes it possible to prevent the deterioration of the reliability of the target switching element.

BRIEF DESCRIPTION OF THE DRAWINGS

A preferred, non-limiting embodiment of the present invention will be described by way of example with reference to the accompanying drawings, in which:

FIG. 11 is a flow chart of the software cutoff process performed by the drive control section in the drive IC in the drive unit according to a fifth exemplary embodiment of the present invention.

DETAILED DESCRIPTION OF THE PREFERRED EMBODIMENTS

Figure 1:
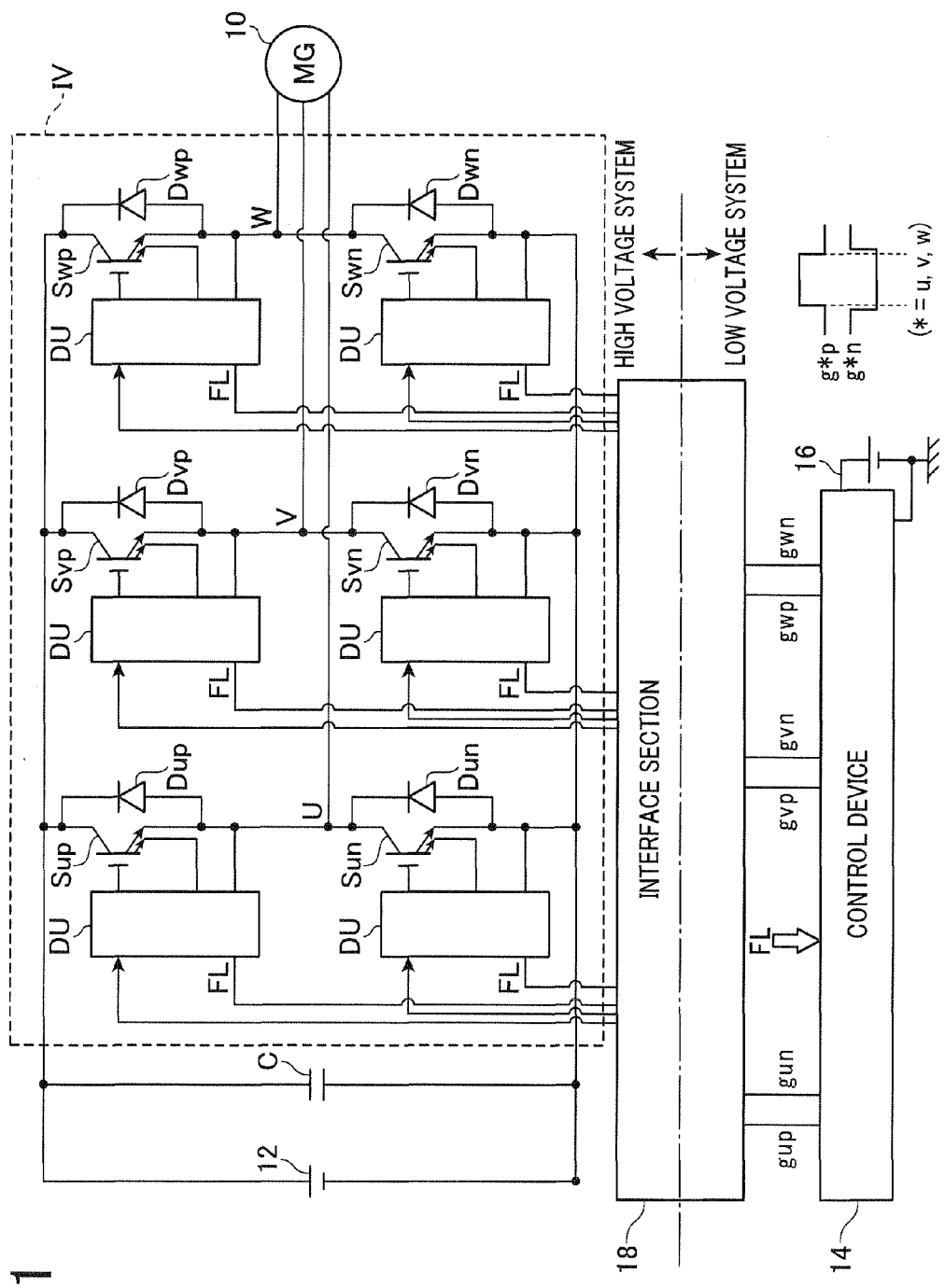
FIG. 1 is a view showing a structure of a motor control system comprised of a control device and an inverter having switching elements and corresponding drive units according to a first exemplary embodiment of the present invention.

Hereinafter, various embodiments of the present invention will be described with reference to the accompanying drawings. In the following description of the various embodiments, like reference characters or numerals designate like or equivalent component parts throughout the several diagrams.

First Exemplary Embodiment

A description will be given of the drive unit according to a first exemplary embodiment with reference to FIG. 1 to FIG. 5. For example, the drive unit DU according to the first exemplary embodiment is used in an inverter IV which drive and control the operation of a motor generator 10 as an electric rotary machine. The motor generator 10 is a main machine of a motor vehicle (omitted from the drawings). The motor vehicle is also equipped with an internal combustion engine (omitted from the drawings).

FIG. 1 is a view showing a structure of a motor control system comprised of the inverter IV, a control device 14 and an interface section 18. The inverter IV is comprised of series connection units. Each of the series connection units is comprised of a semiconductor switching element S*p (*=u, v, w) in a high voltage side and a semiconductor switching element S*n (*=u, v, w) in a low voltage side. As shown in FIG. 1, the semiconductor switching element S*p (*=u, v, w) in a high voltage side and the semiconductor switching element S*n (*=u, v, w) in a low voltage side are connected in series. As shown in FIG. 1, the drive unit DU is arranged for each of the semiconductor switching elements S*p and S*n. Hereinafter, the switching element S*# will be used instead of the semiconductor switching element.

For example, an Insulated Gate Bipolar Transistor (IGBT) is used as the switching element. Each of the switching elements S*# corresponds to a target switching element to be controlled used in the claims.

As shown in FIG. 1, the motor generator 10 is used as a main machine of a motor vehicle. The motor generator 10 is connected to drive wheels with tires of the motor vehicle. The motor generator 10 is connected to a high voltage battery 12 through the inverter IV. The high voltage battery 12 is a DC power source. For example, the high voltage battery 12 outputs a high voltage of not less than 100 V. a boost converter (not shown) is arranged between the high voltage battery 12 and the inverter IV. The boost inverter boosts the output voltage of the high voltage battery 12 and supplies the boosted voltage to the inverter IV.

Figure 3:
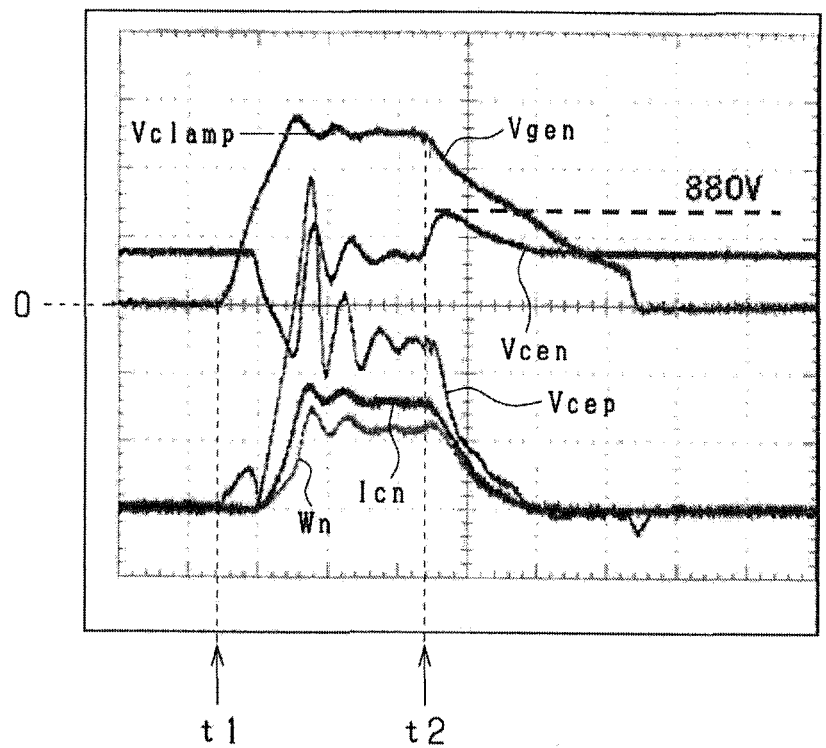
FIG. 3 is a timing chart showing a transition of a collector current, etc. in a type 1 short circuit in upper and lower arms.

The inverter IV is equipped with the series connection units. Each of the series connection units is comprised of a switching element S*p (*=u, v, w) in a high voltage side (or an upper arm side) and a switching element S*n (*=u, v, w) in a low voltage side (or a lower arm side). Specifically, as shown in FIG. 3, the inverter IC is comprised of the three series connection units having the switching element S*p and the switching element S*n (*=u, v, w). Each connection node between the switching element S*p and the switching element S*n is connected to the *phase (*=u, v, w) of the motor generator 10. The first exemplary embodiment uses a semiconductor switching element of a voltage control type as the switching element S*# (#=p, n), more specifically, uses an IGBT. Further, a free wheel diode D*# is connected in parallel and reversely to the corresponding switching element S*#. Each of the switching element S*# corresponds to the switching element used in the claims.

The control device 14 is comprised of a microcomputer which receives electric power supplied from a low voltage battery 16. The control device 14 generates and transmits instruction values to the inverter IV in order to adjust a control value (for example, an output torque) of the motor generator 10 on the basis of the instruction values so that the control value becomes equal to the instruction value. In more detail, the control device 14 generates operation signals g*# and transmits the generated operation signals g*# to the drive units DU in order to control the operation of the switching elements S*# in the inverter IV. In particular, the operation signals g*p for the switching element S*p in a high voltage side and the operation signals g*n for the switching element S*n in a low voltage side are complementary signals to each other. That is, the switching element S*p in a high voltage side and the switching element S*n in a low voltage side are alternately turned on and turned off by these operation signals.

As shown in FIG. 1, the interface section 18 electrically insulates a high voltage system from a low voltage system. The high voltage system is comprised of the high voltage battery 12, the inverter IV and the motor generator 10. The low voltage system is comprised of the low voltage battery 16 and the control device 14. The interface section 18 transmits control signals between the high voltage system and the low voltage system. The interface section 18 is equipped with optical isolator elements such as photo couplers.

A description will now be given of a structure of each of the drive units DU in the inverter IV with reference to FIG. 2.

Figure 2:
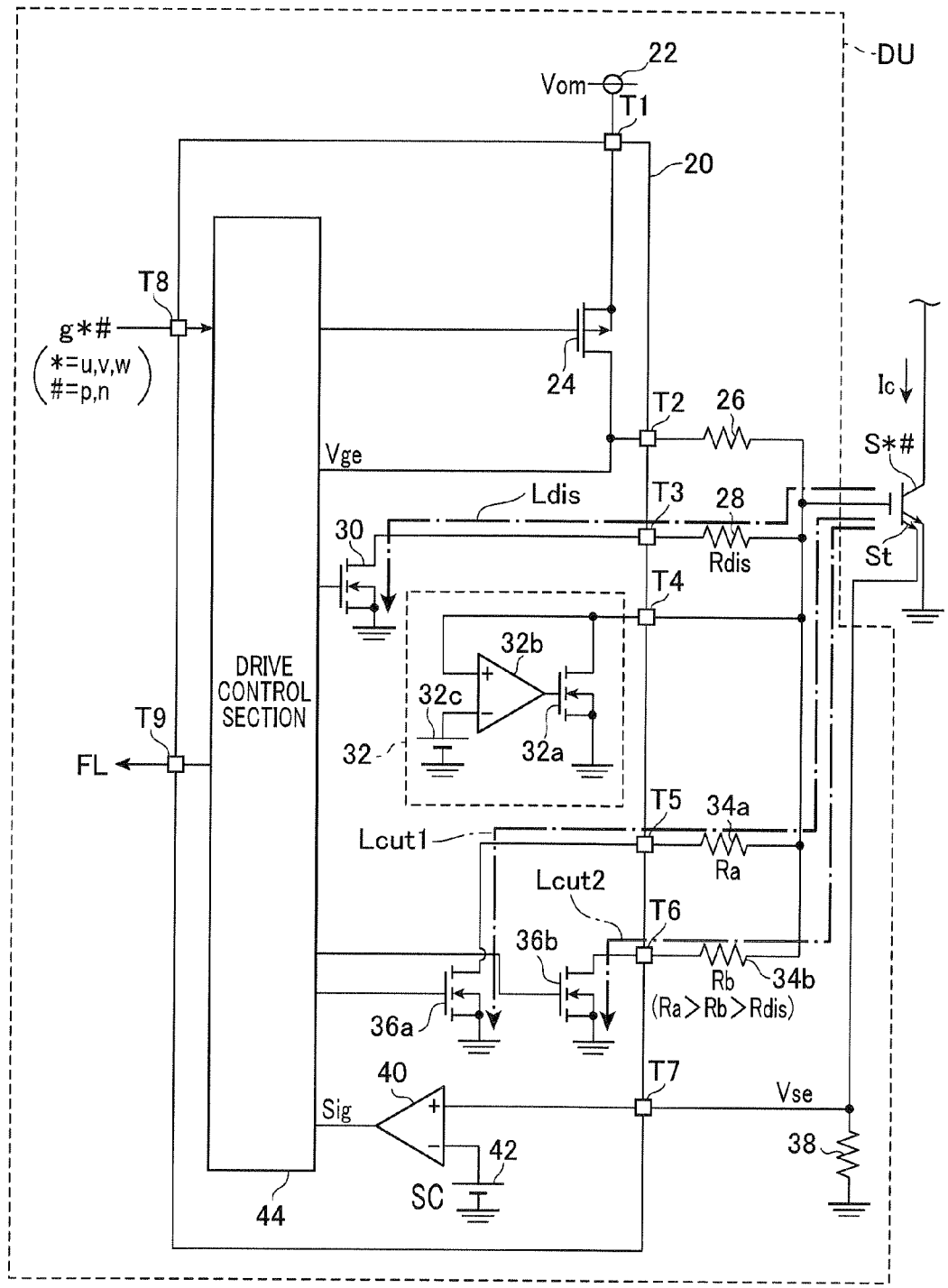
FIG. 2 is a view showing a structure of the drive unit according to the first exemplary embodiment of the present invention.

FIG. 2 is a view showing a structure of the drive unit DU according to the first exemplary embodiment.

As shown in FIG. 2, the drive unit DU is comprised of a drive IC 20 and a constant voltage source 22. The drive IC 20 is a one-chip semiconductor integrated circuit. The constant voltage source 22 outputs a predetermined voltage Vom (for example, 15 V). In more detail, the constant voltage source 22 is connected to a drain terminal of the p channel MOS FET (hereinafter, the switching element 24 for charging) through a first terminal T1 of the drive IC 20. A source terminal of the switching element 24 for charging is connected to an open/close control terminal (or a gate terminal) of the switching element S*# through a second terminal T2 of the drive IC 20 and a resistance 26 for charging.

The gate terminal of the switching element S*# is connected to an output terminal (i.e. an emitter terminal) of the switching element S*# through a resistance 28 for discharging, a third terminal T3 of the drive IC 20 and a N channel MOS FET 30 (hereinafter, the switching element 30 for discharging).

In the first exemplary embodiment, a normal operation mode discharging path Ldis is formed from the gate terminal of the switching element S*# to the emitter terminal of the switching element S*# through the resistance 28 for discharging, the third terminal T3 and the switching element 30 for discharging. The normal operation mode discharging path Ld is used during the normal operation mode, i.e. normal functioning.

During the normal operation mode, i.e. during normal functioning, the charging process and the discharging process are performed on the basis of the turning on instruction and a turning off instruction. The charging process and the discharging process will be explained later.

The gate terminal of the switching element S*# is further connected to a clamping circuit 32 through a fourth terminal T4 of the drive IC 20. The clamping circuit 32 is comprised of a N channel MOS FET (hereinafter, a switching element 32a for clamping), an operational amplifier 32b (high speed operational amplifier) and a first power source 32c. In more detail, the fourth terminal T4 of the drive IC 20 is connected to the emitter terminal of the switching element S*# through a switching element 32a for clamping. The operational amplifier 32b has a non-inverting input terminal and an inverting input terminal. The non-inverting input terminal of the operational amplifier 32b is connected to a connection node between the fourth terminal T4 of the drive IC 20 and the switching element 32a for clamping. The inverting input terminal of the operational amplifier 32b is connected to a positive electrode side of the first power source 32c. The negative electrode side of the first power source 32c is grounded, i.e. connected to the emitter terminal of the switching element S*#.

An output voltage (hereinafter, a clamping voltage Vclamp) of the first power source 32c is adjusted to a voltage by which a gate voltage to be supplied to the open/close control terminal (or the gate terminal) of the switching element S*# to a limit voltage (for example, 12.5 V). This limit voltage prevents an extreme large current from flowing in the switching element S*# within a short period of time. That is, such an extreme large current often deteriorates the operational reliability of the switching element S*#.

The first exemplary embodiment determines and uses the clamping voltage Vclamp which is larger than a threshold voltage Vth by which the switching element S*# is switched to a turned-on state, but less than an upper limit voltage (which is the output voltage Vom of the constant voltage source 22) of the gate voltage Vge of the switching element S*#.

The gate terminal of the switching element S*# is connected to the emitter terminal of the switching element S*# through a first cutoff resistance 34a, the fifth terminal T5 of the drive IC20 and a N channel MOS FET 36a (hereinafter, the first cutoff switching element 36a). The gate terminal of the switching element S*# is further connected to the emitter terminal of the switching element S*# through a second cutoff resistance 34b, a sixth terminal T6 of the drive IC20 and a N channel MOS FET 36b (hereinafter, the second cutoff switching element 36b).

In particular, the drive unit DU according to the first exemplary embodiment uses a first cutoff path Lcut1 which is a path formed from the gate terminal of the switching element S*# to the emitter terminal of the switching element S*# through the first cutoff resistance 34a, the fifth terminal T5 of the drive IC20 and the first cutoff switching element 36a. The first cutoff path Lcut1 is closed when the first cutoff switching element 36a is turned on (i.e. a closing operation), and the first cutoff path Lcut1 is opened when the first cutoff switching element 36a is turned off (i.e. an opening operation).

The first exemplary embodiment further uses a second cutoff path Lcut2 which is formed from the gate terminal of the switching element S*# to the emitter terminal of the switching element S*# through the second cutoff resistance 34b, the sixth terminal T6 of the drive IC20 and the second cutoff switching element 36b. The second cutoff path Lcut2 is closed when the second cutoff switching element 36b is turned on (i.e. a closing operation), and the second cutoff path Lcut2 is opened when the second cutoff switching element 36b is turned off (i.e. an opening operation).

Still further, the first cutoff path Lcut1 and the second cutoff path Lcut2 form a software cutoff path.

The switching element S*# has a sense terminal St which outputs a small current (for example, approximately $1/10000$ of the collector current Ic) which correlates to a current which flows between the input terminal (or the collector terminal) and the emitter terminal of the switching element S*#. The sense terminal St is connected to the emitter terminal of the switching element S*# through a sense resistance 38. A voltage drop occurs in the sense resistance 38 due to a small current flowing from the sense terminal St. It is accordingly possible to recognize a voltage potential at the sense resistance 38, i.e. the sense terminal St side as a correlation state value which correlates to the collector current in the switching element S*#.

In the first exemplary embodiment, the sense terminal St and the sense resistance 38 form a current detection section. Further, the first exemplary embodiment defines that the sense voltage Vse has a positive value when the voltage of the sense resistance 38 at the sense terminal St side is higher than the emitter voltage of the switching element S*#.

The sense voltage Vse is supplied to a non-inverting input terminal of a comparator 40 through a seventh terminal T7 of the drive IC 20. The output voltage (hereinafter, a short-circuit threshold value SC) of the second power source 42 is supplied to an inverting input terminal of the comparator 40. In the first exemplary embodiment, the output voltage of the second power source 42 is adjusted to the sense voltage Vse which corresponds to the collector current Ic when the short circuit between the upper arm and the lower arm is generated. An output signal Sig of the comparator 40 is supplied to a drive control section 44 of the drive IC 20.

The first exemplary embodiment defines a type 1 short circuit in upper and lower arms between the upper arm and the lower arm in order to determine the short circuit threshold value SC so that a path of an overcurrent (a short circuit current) of the switching element S*# is formed when both the switching element S*p and the switching element S*n are simultaneously turned on by turning on one of the switching element S*p and the switching element S*n when a short circuit failure occurs in one of the switching element S*p in a high voltage side and the switching element S*n in a low voltage side.

In the first exemplary embodiment, the switching element S*# is turned on when the gate voltage Vge of the switching element S*# becomes not less than the threshold voltage Vth.

The drive control section 44 controls the operation of the switching element 24 for charging and the switching element 30 for discharging. The drive control section 44 receives the operation signal g*# through an eighth terminal T8 of the drive IC 20, and turns on and off alternately the switching element 24 for charging and the switching element 30 for discharging on the basis of the received operation signal g*# in order to drive the switching element S*#. In more detail, when the operation signal g*# indicates the turning-on operation instruction in order to perform a charging process, the switching element 30 for discharging is turned off and the switching element 24 for charging is turned on.

On the other hand, when the operation signal g*# indicates the turning-off operation instruction in order to perform a discharging process, the switching element 30 for discharging is turned on and the switching element 24 for charging is turned off. This process turns off the switching element S*#.

The drive control section 44 further performs the overcurrent protection process on the basis of the gate voltage Vge of the switching element S*# through the second terminal T2 of the drive IC 20 and the sense voltage Vse obtained through the seventh terminal T7 of the drive IC 20, etc. The overcurrent protection process has the clamping process and the software cutoff process.

The clamping process controls the operation of the switching element 32a for clamping when an enable signal is supplied to the operational amplifier 32b during a clamping filter time period (fro example, (during 1.6 µseconds) before the gate voltage Vge of the switching element 32a for clamping reaches the output voltage Vom of the constant voltage source 22 under a condition in which the operation signal g*# indicates the turning on instruction in order to perform the charging process. This clamping process can limit the collector current Ic which flows in the switching element S*# until the switching element S*# is turned off by the software cutoff process (which will be explained later) under the condition in which the short circuit between the upper arm and the lower arm occurs.

A description will now be given of the software cutoff process.

When a logical high level (H) of the output signal Sig of the comparator 40 is continued during a short circuit filter period Tsc (which corresponding to a specified time period), the software cutoff process turns off the switching element 24 for charging and the switching element 30 for discharging in order to turn on one of the first cutoff switching element 36a and the second cutoff switching element 36b. The execution of the software cutoff process forcedly turns on the switching element S*#, and cuts off the collector current in the switching element S*#.

The first cutoff resistance 34a and the second cutoff resistance 34b are used for increasing a resistance of the discharging path through which the electric charges of the gate terminal of the switching element S*# are discharged.

The first cutoff resistance 34a and the second cutoff resistance 34b are arranged to avoid a high surge voltage when the switching element S*# is switched from the turned-on state to the turned-off state, i.e. the cutoff speed of the switching element S*# is high under the condition in which the collector current Ic is extremely high.

In the first exemplary embodiment, the resistance value Ra of the first cutoff resistance 34a is higher than the resistance value Rb of the second cutoff resistance 34b. Further, the resistance value Rb of the second cutoff resistance 34b is higher than the resistance value Rdis of the resistance 28 for discharging. The resistance value of the first cutoff path Lcut1 becomes thereby higher than the resistance value of the second cutoff path Lcut2, and the resistance value of the second cutoff path Lcut2 becomes higher than the resistance value of the normal operation mode discharging path Ldis.

A description will now be given of the software cutoff process in more detail.

In the first exemplary embodiment, the switching element S*# is forcedly switched to the turned-off state by the software cutoff process on the basis of a condition whether or not the switching element S*# is in a completely turned-on state (or a full turned-on state). In more detail, when the software cutoff process is performed under a condition in which the switching element S*# is in the completely turned-on state, the drive control section 44 turns on the second cutoff switching element 36b, and turns off the first cutoff switching element 36a in order to use the second cutoff path Lcut2.

On the other hand, when the software cutoff process is performed under a condition in which the switching element S*# is in the completely turned-on state, the drive control section 44 turns on the first cutoff switching element 36a, and then turns off the second cutoff switching element 36b in order to use the first cutoff path Lcut.

The state of the completely turned-on state of the switching elements S*# indicates that the gate voltage Vge of the switching element S*# is adequately higher than the threshold voltage Vth. In more detail, the completely turned-on state of the switching element S*# indicates a state in which the gate voltage Vge of the switching element S*# becomes higher than the clamping voltage Vclamp. In particular, the first exemplary embodiment determines that the state in which the switching elements S*# in the completely turned-on state indicates the state when the gate voltage Vge of the switching element S*# is equal to the output voltage Vom of the constant voltage source 22 or when the gate voltage Vge of the switching element S*# exceeds the output voltage Vom of the constant voltage source 22.

The first exemplary embodiment selects one of the first cutoff path Lcut1 and the second cutoff path Lcut2 on the basis of whether or not the switching element S*# is in the completely turned-on state. This feature provide a countermeasure to the type 2 short circuit in upper and lower arms in addition to the type 1 short circuit in upper and lower arms.

The first exemplary embodiment defines the type 2 short circuit in upper and lower arms in which when one of the switching element S*p in a high voltage side and the switching element S*n in a low voltage side is completely turned on, and a short circuit failure occurs in the other switching elements.

A description will now be given of the type 1 short circuit in upper and lower arms and the type 2 short circuit in upper and lower arms in more detail. After this, the software cutoff process will be explained in more detail later.

A description will now be given of the type 1 short circuit in upper and lower arms and the type 2 short circuit in upper and lower arms with reference to FIG. 3 and FIG. 4.

FIG. 3 is a timing chart showing a transition of a collector current, etc. in the type 1 short circuit in upper and lower arms. FIG. 4 is a timing chart showing a transition of a collector current, etc. in the type 2 short circuit in upper and lower arms.

Figure 4:
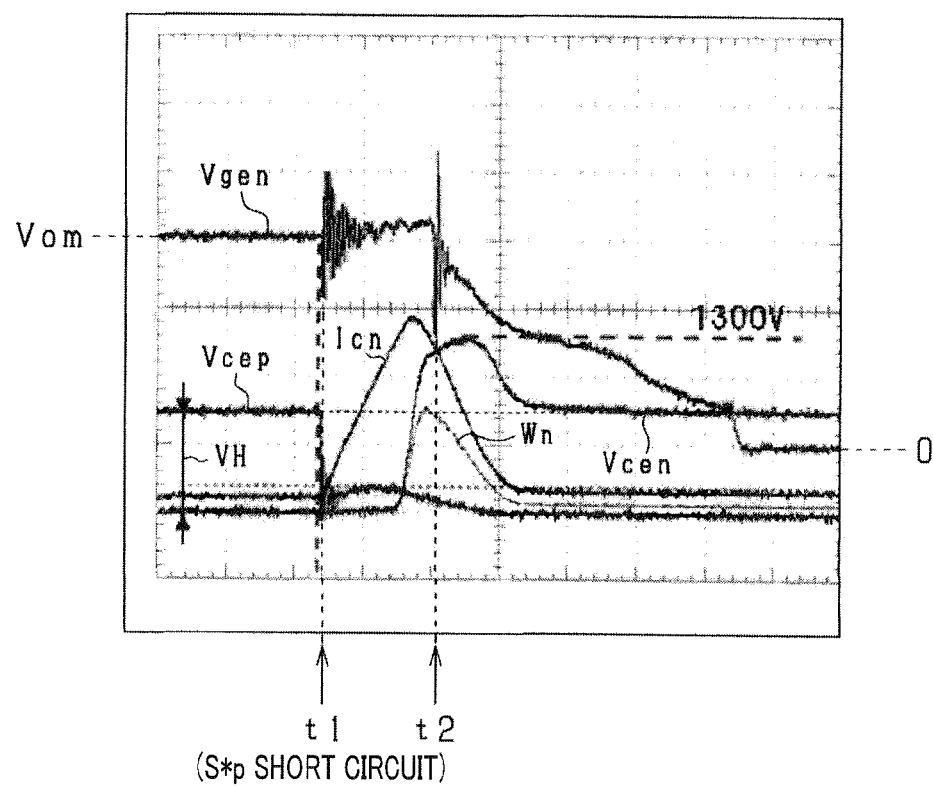
FIG. 4 is a timing chart showing a transition of a collector current, etc. in a type 2 short circuit in upper and lower arms.

That is, FIG. 3 and FIG. 4 show the transition of a gate voltage Vgen, a collector current Icn, a voltage Vcen and a power loss Wn between the collector terminal and the emitter terminal of the switching element S*n in a low voltage side, and a voltage Vcep between the collector terminal and the emitter terminal of the switching element S*p in a high voltage side. The power loss Wn indicates an integrated value of the collector current Icn and the voltage Vcen between the collector terminal and the emitter terminal.

In particular, FIG. 3 and FIG. 4 show the occurrence of the type 2 short circuit in upper and lower arms when a short circuit failure occurs in the switching element S*p in a high voltage side under a condition in which the switching element S*n in a low voltage side is completely turned on. The software cutoff process shown in FIG. 3 and the software cutoff process shown in FIG. 4 use the software cutoff path having the same resistance value.

Further, the software cutoff process shown in FIG. 3 and the software cutoff process shown in FIG. 4 use the same unit length (scales in a vertical direction and a horizontal direction in FIG. 3 and FIG. 4) regarding the gate voltage Vgen of the switching element S*#. In particular, the scale in a vertical direction of the collector current Icn, the voltage Vcen between the collector terminal and the emitter terminal of the switching element S*n and the voltage Vcep between the collector terminal and the emitter terminal of the switching element S*p is larger than those shown in FIG. 3.

A description will now be given of the type 1 short circuit in upper and lower arms with reference to FIG. 3.

As shown in FIG. 3, under the condition in which a short circuit failure occurs in the switching elements S*p in a high voltage side, the switching element S*n in a low voltage side are switched to the turned-on state at a timing t1. This operation increases the gate voltage Vgen of the switching element S*n. After this, the clamping voltage Vclamp by the clamping process limits the gate voltage Vgen of the switching elements S*n.

Under the condition in which the gate voltage Vgen of the switching element S*n is limited by the clamping voltage Vclamp, when the comparator 40 continuously outputs a high level (H) value of the logical value of the output signal Sig during the short circuit filter period Tsc, the drive control section 44 detects the logical high level (H) of the output signal Sig of the comparator 40. The software cutoff process decreases the gate voltage Vgen of the switching element S* at the timing t2. After this, the switching elements S*# are forcedly turned off.

A description will now be given of the type 2 short circuit in upper and lower arms with reference to FIG. 4.

As shown in FIG. 4, under the condition in which the switching element S*n in a low voltage side is in the completely turned-on state, a short circuit failure occurs in the switching element S*p in a high voltage side. This starts to flow a short circuit current which in the switching element S*p in a high voltage side and the switching element S*n in a low voltage side.

After this, the drive control section 44 performs the software cutoff process and this decreases the gate voltage Vgen of the switching element S*n. As a result, the switching element S*# is forcedly turned off. Because the switching element S*# is in the completely turned-on state, a collector current Icn when the switching element S*# is forcedly turned off is larger than the collector current Icn when the switching element S*# is forcedly turned off in the type 1 short circuit in upper and lower arms.

A surge voltage (for example, 1300 V) generated by the software cutoff process performed in the type 2 short circuit in upper and lower arms is higher than a surge voltage (for example, 800 V) generated by the software cutoff process performed in the type 2 short circuit in upper and lower arms.

Accordingly, when executing the software cutoff process, forced turning-off of the switching element S*# in the type 2 short circuit in upper and lower arms decreases a reliability of the switching elements S*#.

A short circuit energy (for example, 0.8 J) as a time integrated value of the loss Wn generated when the type 2 short circuit in upper and lower arms occurs is smaller than a short circuit energy (for example, 0.38 J) as a time integrated value of the loss Wn generated when the type 1 short circuit in upper and lower arms occurs. As shown in FIG. 3 and FIG. 4, during the software cutoff process, the voltage Vcen between the collector terminal and the emitter terminal of the switching element S*n under the type 2 short circuit in upper and lower arms is lower than the voltage Vcen between the collector terminal and the emitter terminal of the switching element S*n under the type 1 short circuit in upper and lower arms. The reason why the voltage Vcen between the collector terminal and the emitter terminal of the switching element is low when the type 2 short circuit in upper and lower arms occurs is because much of the output voltage VH of the high voltage battery 12 is supplied to the switching element S*p in a high voltage side when the type 2 short circuit in upper and lower arms occurs.

As previously described in detail, the short circuit energy generated when the type 2 short circuit in upper and lower arms occurs is smaller than the short circuit energy generated when the type 1 short circuit in upper and lower arms occurs. This means that the short circuit energy of the switching element S*# when the type 2 short circuit in upper and lower arms occurs is kept a certain margin below the upper allowable value. Further, the more the discharging speed of the gate electric charges by the software cutoff process, the more the short circuit energy increases, but the magnitude of the surge voltage can be decreased. Accordingly, under the type 2 short circuit in upper and lower arms, it is possible to decrease the surge voltage while maintaining the short circuit energy within a range of not more than the upper limit of the allowable value by decreasing the discharging speed of the gate electric charges. The first exemplary embodiment performs the software cut-off process in order to prevent the decreasing of the reliability of the switching element S*#.

A description will now be given of the software cutoff process performed by the drive control section 44 in the drive IC 20 in the drive unit DU according to the first exemplary embodiment with reference to FIG. 5.

Figure 5:
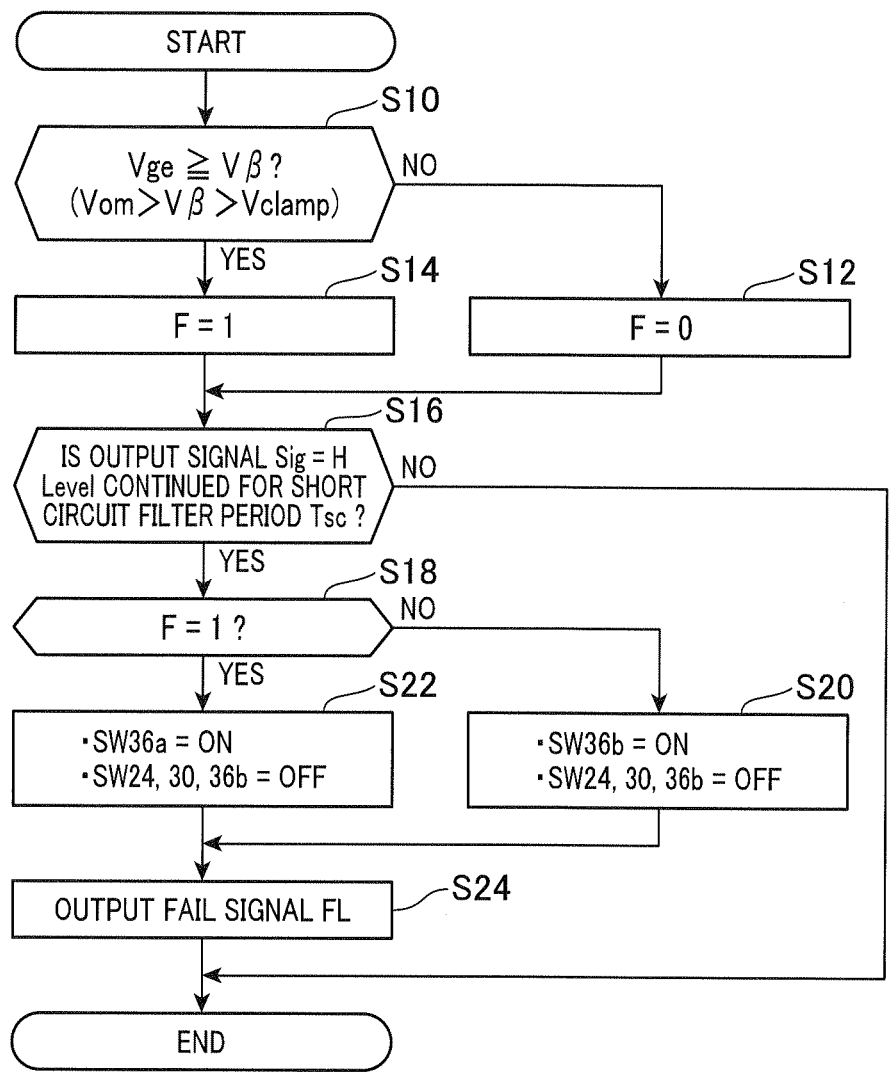
FIG. 5 is a flow chart of a software cutoff process performed by a drive control section in a drive IC in the drive unit according to the first exemplary embodiment of the present invention.

FIG. 5 is a view showing a flow chart of the software cutoff process performed by a drive control section in the drive unit according to the first exemplary embodiment. The drive control section 44 in the drive IC 20 in the drive unit DU repeatedly performs the software cutoff process shown in FIG. 5 every predetermined time interval. In the first exemplary embodiment, because the drive control section 44 is a hardware device, the logic circuits in the hardware device perform the process shown in FIG. 5.

In step S10 shown in FIG. 5, the drive control section 44 detects whether or not the gate voltage Vge is not less than a predetermined voltage $V\beta$. The drive control section 44 in the drive IC 20 in the drive unit DU in the first exemplary embodiment uses the predetermined voltage $V\beta$ which is less than the output voltage Vom of the constant voltage source 22 and more than the clamping voltage Vclamp (for example, within 13 to 14 V). In the process of step S10, the drive control section 44 detects whether or not the switching element S*# is in the completely turned-on state.

When the detection result in step S10 indicates negation ("NO" in step S10), i.e. Vge<Vβ, the operation flow goes to step S12. In step S12, the drive control section 44 sets the value of zero to a judgment flag F (F=0). The judgment flag F having a value of zero (F=0) indicates that the switching element S*# is in the incompletely turned-on state. On the other hand, the judgment flag F having a value of 1 (F=1) indicates that the switching element S*# is in the completely turned-on state.

On the other hand, when the detection result in step S10 indicates affirmation ("YES" in step S10), i.e. Vge≥Vβ, the operation flow goes to step S14. In step S14, the drive control section 44 sets the value of 1 to the judgment flag F (F=1).

After the completion of the process in step S12 or S14, the operation flow goes to step S16. In step S16, the drive control section 44 judges whether or not the logical value of the output signal Sig of the comparator 40 has the high level (H) continuously for the short circuit filter period Tsc. When the judgment result in step S16 indicates affirmation ("YES" in step S16), the operation flow goes to step S18. In step S18, the drive control section 44 detects whether or not the judgment flag F has the value of 1

When the judgment result in step S18 indicates negation ("NO" in step S18), the operation flow goes to step S20. In step S20, the drive control section 44 turns on the second cutoff switching element 36b and turns off both the switching element 30 for discharging and the first cutoff switching element 36a.

On the other hand, when the judgment result in step S18 indicates affirmation ("YES" in step S18), the drive control section 44 recognizes that the switching element S*# is in the completely turned-on state. The operation flow goes to step S22.

In step S22, the drive control section 44 turns on the first cutoff switching element 36a, and turns off the switching element 24 for charging, the switching element 30 for discharging, and the second cutoff switching element 36b. This operation increases resistance value of the electric path to be used for discharging the gate electric charges of the switching element S*#, and as a result decreases the discharging speed of the gate electric charges of the switching element S*#. Accordingly, it is possible to significantly suppress the surge voltage.

By the way, the processes in step S16 to S22 correspond to the turning-off section used in the claims, and the processes in step S18 to S22 correspond to the processing section used in the claims.

After the completion of the processes in step S20 or the process in step S22, the operation flow goes to step S24. In step S24, the drive control section 44 generates and outputs a fail signal FL. As shown in FIG. 2, the drive control section 44 outputs the fail signal FL to the control device 14 in the low voltage system through a ninth terminal T9 of the drive IC 20 in the drive unit DU. When receiving the fail signal FL transmitted from the drive control section 44 in the drive IC 20 through the interface section 18, the control device 14 shuts down the inverter IV.

On the other hand, when the judgment result in step S16 indicates negation ("NO" in step S16) and when the process in step S24 is completed, the drive control section 44 completes the routine in the flow chart shown in FIG. 5.

As previously described, the drive control section 44 switches the electric path for discharging the gate electric charges of the switching element S*# from the second cutoff path Lcut2 to the first cutoff path Lcut1 when the drive control section 44 in the drive IC 20 performs the software cutoff process under the condition in which the switching element S*# is in the completely turned-on state. This switching process can decrease a discharging speed of the gate electric charges of the switching element S*# and suppress a magnitude of a generated surge voltage. This makes it possible to avoid the reliability of the switching element S*# from decreasing. According to the first exemplary embodiment, it is possible to select the correct overcurrent protection process of the switching element S*# depending on the type of short circuit such as the type 1 short circuit in upper and lower arms, and the type 2 short circuit in upper and lower arms.

Second Exemplary Embodiment

A description will be given of the software cutoff process performed by the drive control section 44 in the drive IC 20 in the drive unit DU according to a second exemplary embodiment with reference to FIG. 6 and FIG. 7.

The second exemplary embodiment discloses the software cutoff process performed by the drive control section 44 which is different from the software cutoff process according to the first exemplary embodiment. The following explanation will show a difference between the second exemplary embodiment and the first exemplary embodiment. The explanation for the same components and processes between the first and second exemplary embodiments is omitted here for brevity.

Figure 6:
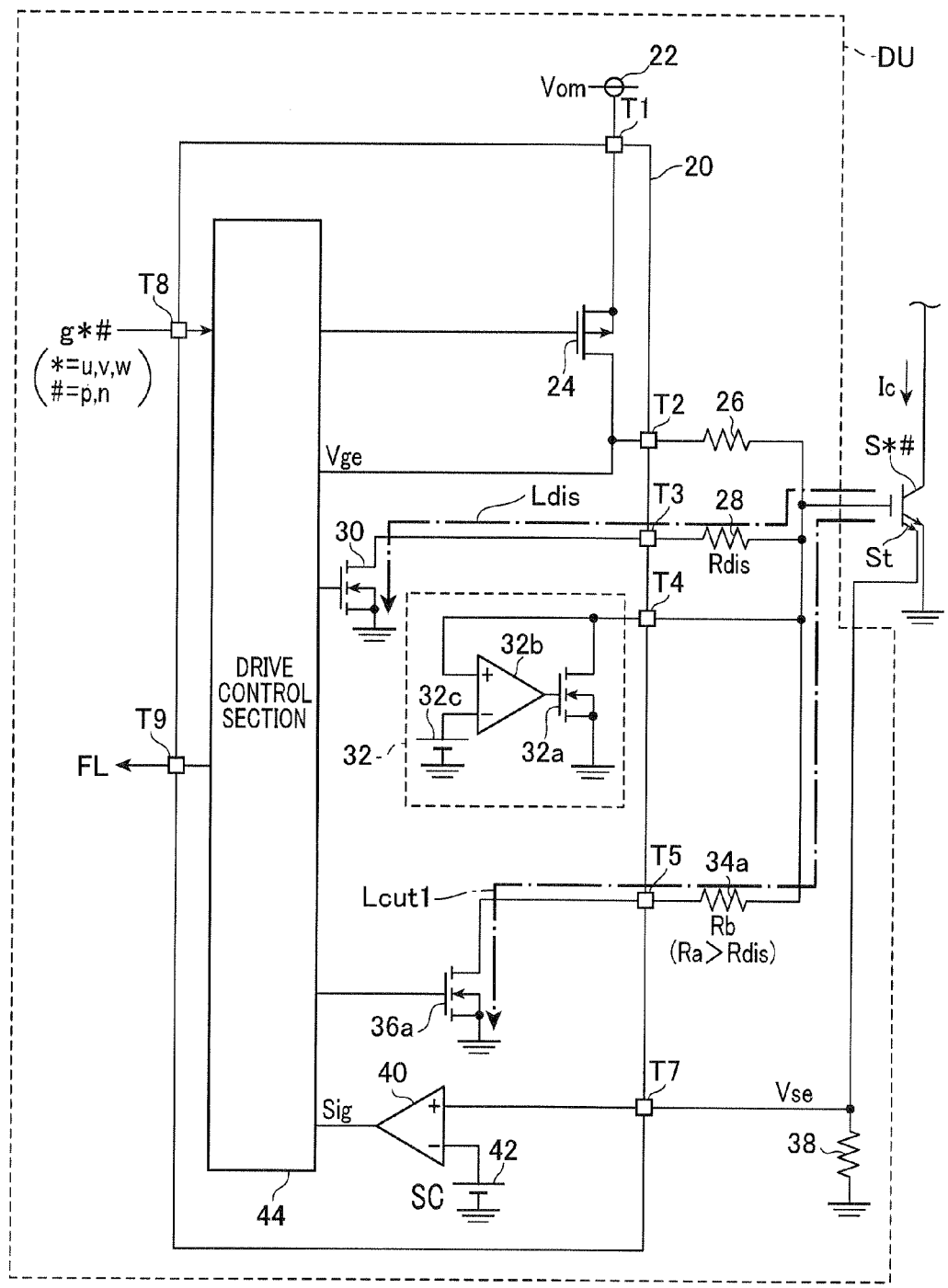
FIG. 6 is a view showing a structure of the drive unit according to a second exemplary embodiment of the present invention.

FIG. 6 is a view showing a structure of the drive unit DU according to the second exemplary embodiment. The same components between the drive unit DU shown in FIG. 1 and the drive unit DU shown in FIG. 6 will be referred with the same numbers and characters.

As shown in FIG. 6, the drive IC 20 in the drive unit DU according to the second exemplary embodiment does not use the second cutoff path Lcut2. Further, the drive IC 20 does not have the second cutoff resistance 34b and the second cutoff switching element 36b. That is, the second cutoff path Lcut2, the second cutoff path Lcut2, the second cutoff resistance 34b and the second cutoff switching element 36b are eliminated from the structure of the drive IC 20 in the drive unit DU according to the second exemplary embodiment.

Still further, the number of the terminals in the drive IC 20 is decreased by one because the terminal T6 used for the second cutoff path Lcut2 is eliminated.

Figure 7:
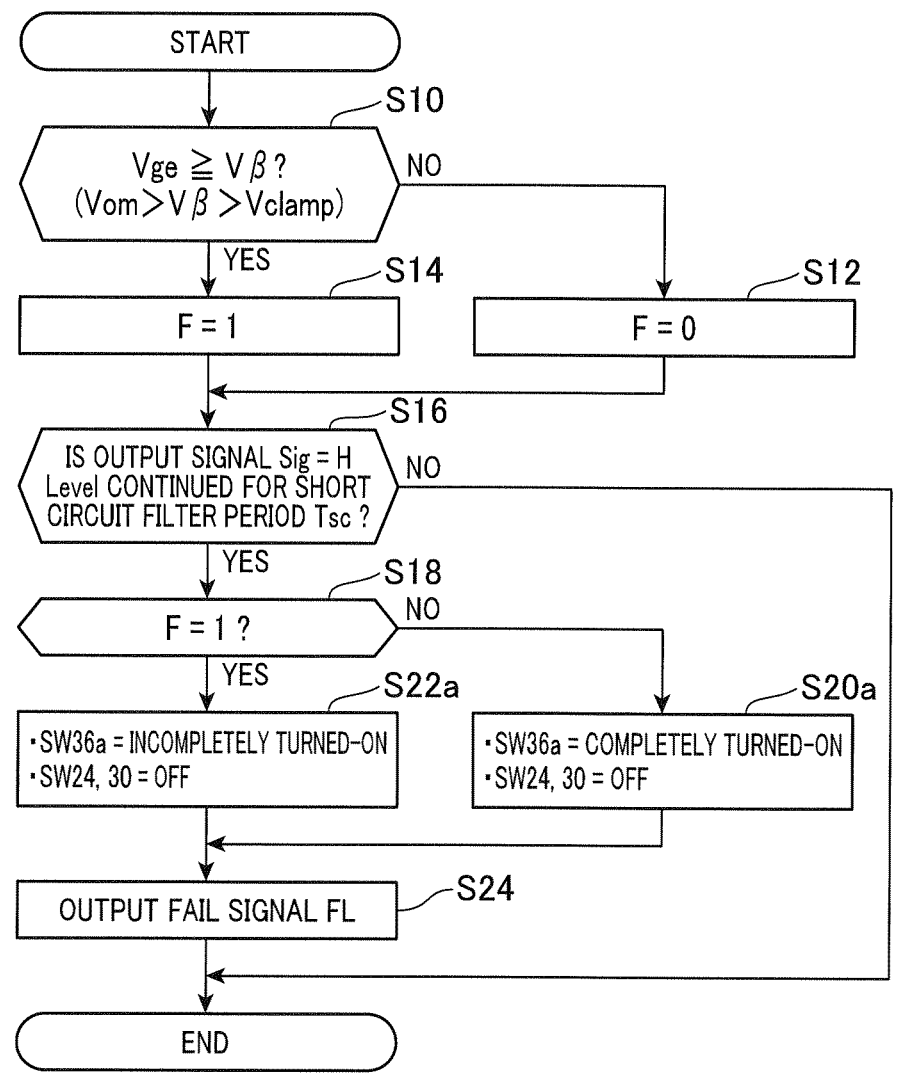
FIG. 7 is a flow chart of the software cutoff process performed by the drive control section in the drive IC in the drive unit according to the second exemplary embodiment of the present invention.

FIG. 7 is a view showing a flow chart of the software cutoff process performed by the drive control section 44 in drive IC 20 in the drive unit DU according to the second exemplary embodiment.

The drive control section 44 shown in FIG. 6 repeatedly performs the software cutoff process shown in FIG. 7 every predetermined time interval.

The same processes between the flow charts shown in FIG. 5 and FIG. 7 will be referred with the same reference characters.

In the second exemplary embodiment, because the drive control section 44 in the drive IC 20 is a hardware device, the logic circuits in the hardware device perform the process shown in FIG. 7.

In the routine in the flow chart shown in FIG. 7, when the judgment result in step S18 indicates negation ("NO" in step S18), i.e. F≠1, the drive control section 44 recognizes that the switching element S*# is in the incompletely turned-on state. The operation flow goes to step S20a.

In step 20a, the drive control section 44 enters the first cutoff switching element 36a to the completely turned-on state, and turns off the switching element 24 for charging and the switching element 30 for discharging.

In the second exemplary embodiment, the completely turned-on state of the first cutoff switching element 36a indicates a state in which the drive control section 44 adjusts a gate voltage and supplies the gate voltage to the open/close control terminal (i.e. the gate terminal) of the first cutoff switching element 36a so that the first cutoff switching element 36a in the non-saturated state is completely turned on.

The non-saturated area of the first cutoff switching element 36a indicates the area in which the drain current Id increases according to the increasing of the drain-source voltage Vd of the first cutoff switching element 36a on the basis of the output characteristics of the first cutoff switching element 36a. This output characteristics of the first cutoff switching element 36a show a relationship between the drain-source voltage Vds and the drain current Id in the first cutoff switching element 36a.

When the first cutoff switching element 36a is driven in the non-saturated area, the on-resistance of the first cutoff switching element 36a becomes substantially zero.

On the other hand, when the judgment result in step S18 indicates affirmation ("YES" in step S18), the drive control section 44 recognizes that the switching element S*# is in the completely turned-on state. The operation flow goes to step S22a.

In step S22a, the drive control section 44 turns half on the first cutoff switching element 36a, i.e. enters the first cutoff switching element 36a in a half turned-on state. Further, the drive control section 44 turns off the switching element 24 for charging and the switching element 30 for discharging.

The process in step S22a increases the on-resistance of the first cutoff switching element 36a by adjusting the gate voltage of the first cutoff switching element 36a. In particular, the incompletely turned-on state (the half turned-on state) of the first cutoff switching element 36a indicates a state in which the drive control section 44 sets a voltage for driving the first cutoff switching element 36a with a saturated area to the gate voltage to be supplied to the open/close control terminal (i.e. the gate terminal) of the first cutoff switching element 36a when the first cutoff switching element 36a is turned on.

The saturated area of the first cutoff switching element 36a indicates the area in which the drain current Id has a constant value regardless of a magnitude of the drain-source voltage of the first cutoff switching element 36a in the output characteristics of the first cutoff switching element 36a show a relationship between the drain-source voltage Vds and the drain current Id in the first cutoff switching element 36a.

When the first cutoff switching element 36a is driven in the saturated area, the on-resistance of the first cutoff switching element 36a is increased. This makes it possible to decrease the discharging speed of the gate electric charges of the switching element S*# when the software cutoff process is performed.

When the judgment result in step S16 indicates negation ("NO" in step S16) and when the process in step S24 is completed, the drive control section 44 completes the routine in the flow chart shown in FIG. 7.

As previously described, it is possible for the drive unit DU according to the second exemplary embodiment to have the same effects of the drive unit DU according to the first exemplary embodiment.

Third Exemplary Embodiment

A description will be given of the software cutoff process performed by the drive control section 44 in the drive IC 20 in the drive unit DU according to a third exemplary embodiment with reference to FIG. 8.

The third exemplary embodiment discloses the software cutoff process performed by the drive control section 44 which is different from the software cutoff process according to the first exemplary embodiment. The following explanation will show a difference between the third exemplary embodiment and the first exemplary embodiment. The explanation for the same components and processes between the third exemplary embodiment and the second exemplary embodiment is omitted here for brevity.

Figure 8:
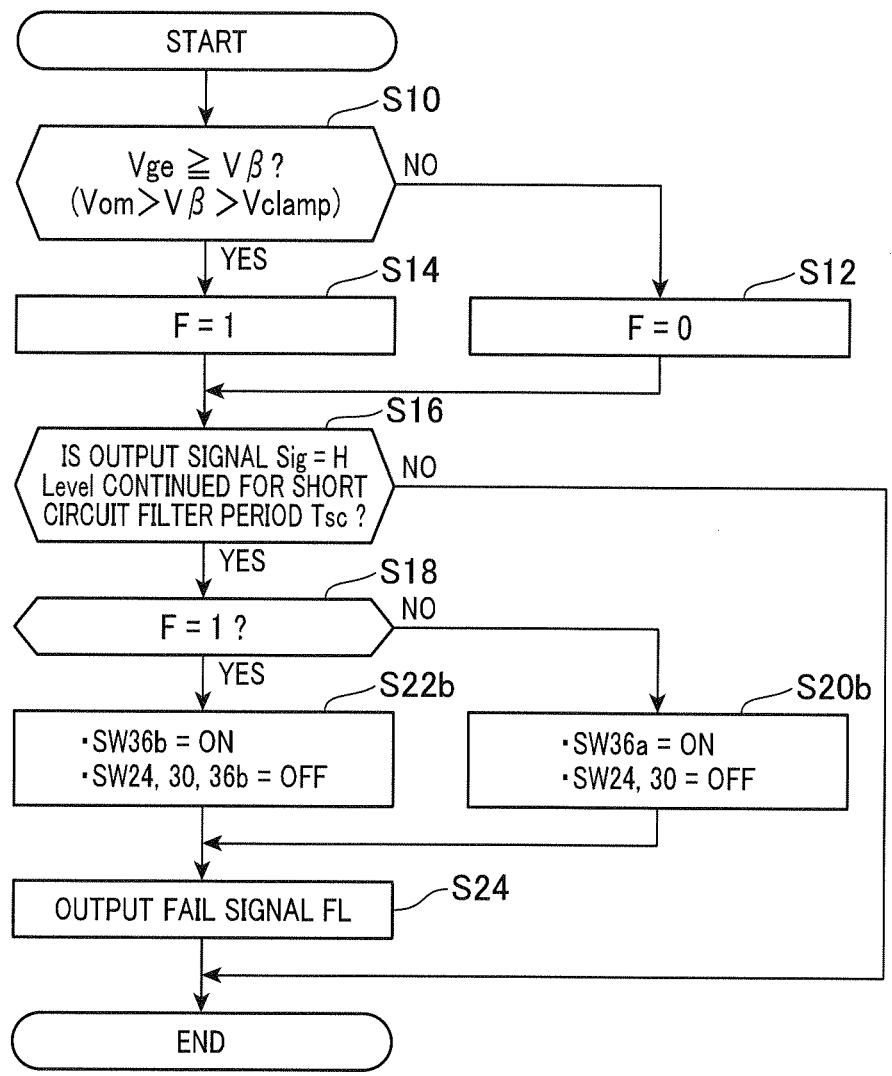
FIG. 8 is a flow chart of the software cutoff process performed by the drive control section in the drive IC in the drive unit according to a third exemplary embodiment of the present invention.

FIG. 8 is a view showing a flow chart of the software cutoff process performed by the drive control section 44 in the drive IC 20 in the drive unit DU according to the third exemplary embodiment.

The drive control section 44 repeatedly performs the software cutoff process shown in FIG. 8 every predetermined time interval. The same processes between the flow charts shown in FIG. 5 and FIG. 8 will be referred with the same reference characters. In the third exemplary embodiment, because the drive control section 44 is a hardware device, logic circuits in the hardware device perform the process shown in FIG. 8.

In the routine of the flow chart shown in FIG. 8, when the judgment result in step S18 indicates negation ("NO" in step S18), the operation flow goes to step S20b.

In step 20b, the drive control section 44 turns on the first cutoff switching element 36a and the second cutoff switching element 36b, and turns off the switching element 24 for charging and the switching element 30 for discharging.

On the other hand, when the judgment result in step S18 indicates affirmation ("YES" in step S18), the operation flow goes to step S22b.

In step S22b, the drive control section 44 turns on the second cutoff switching element 36b, and turns off the switching element 24 for charging, the switching element 30 for discharging, and the first cutoff switching element 36a. This process decreases the discharging speed of the gate electric charges of the switching element S*# during the software cutoff process.

When the judgment result in step S16 indicates negation ("NO" in step S16) and when the process in step S24 is completed, the drive control section 44 completes the routine in the flow chart shown in FIG. 8.

The reason why the drive control section 44 performs the software cutoff process shown in FIG. 8 is as follows.

In the software cutoff process shown in FIG. 5 performed by the drive unit DU according to the first exemplary embodiment, the drive control section 44 controls the software cutoff process to turn on the second cutoff switching element 36b until the judgment flag F changes from 0 to 1 after the operation signal g*# is switched to a turning on operation instruction.

On the other hand, after the judgment flag F changes to 0, the drive control section 44 selects the first cutoff switching element 36a to be turned on by the software cutoff process. When the type 2 short circuit in upper and lower arms occurs immediately after the clamping process is completed, the gate electric charges of the switching element S*# are discharged by the software cutoff process during when the judgment flag F changes from 0 to 1.

In this case, there is a possibility of turning on the first cutoff switching element 36a and the second cutoff switching element 36b simultaneously at a time near the timing when the judgment flag F is switched on the basis of the response characteristics of the first cutoff switching element 36a and the second cutoff switching element 36b. During this timing, the discharging of the gate electric charges of the switching element S*# is halted.

According to the third exemplary embodiment, once the discharging of the gate electric charges of the switching element S*# is initiated by the software cutoff process, the second cutoff switching element 36b is always turned on. This can avoid the interruption of the discharging of the gate electric charges of the switching element S*# at a time near the timing when the judgment flag F is switched. It is therefore possible for the software cutoff process to correctly turn off the switching element S*#.

Fourth Exemplary Embodiment

A description will be given of the drive unit DU according to a fourth exemplary embodiment with reference to FIG. 9.

The drive unit DU according to the fourth exemplary embodiment is different in structure from the drive unit DU according to the first exemplary embodiment.

Figure 9:
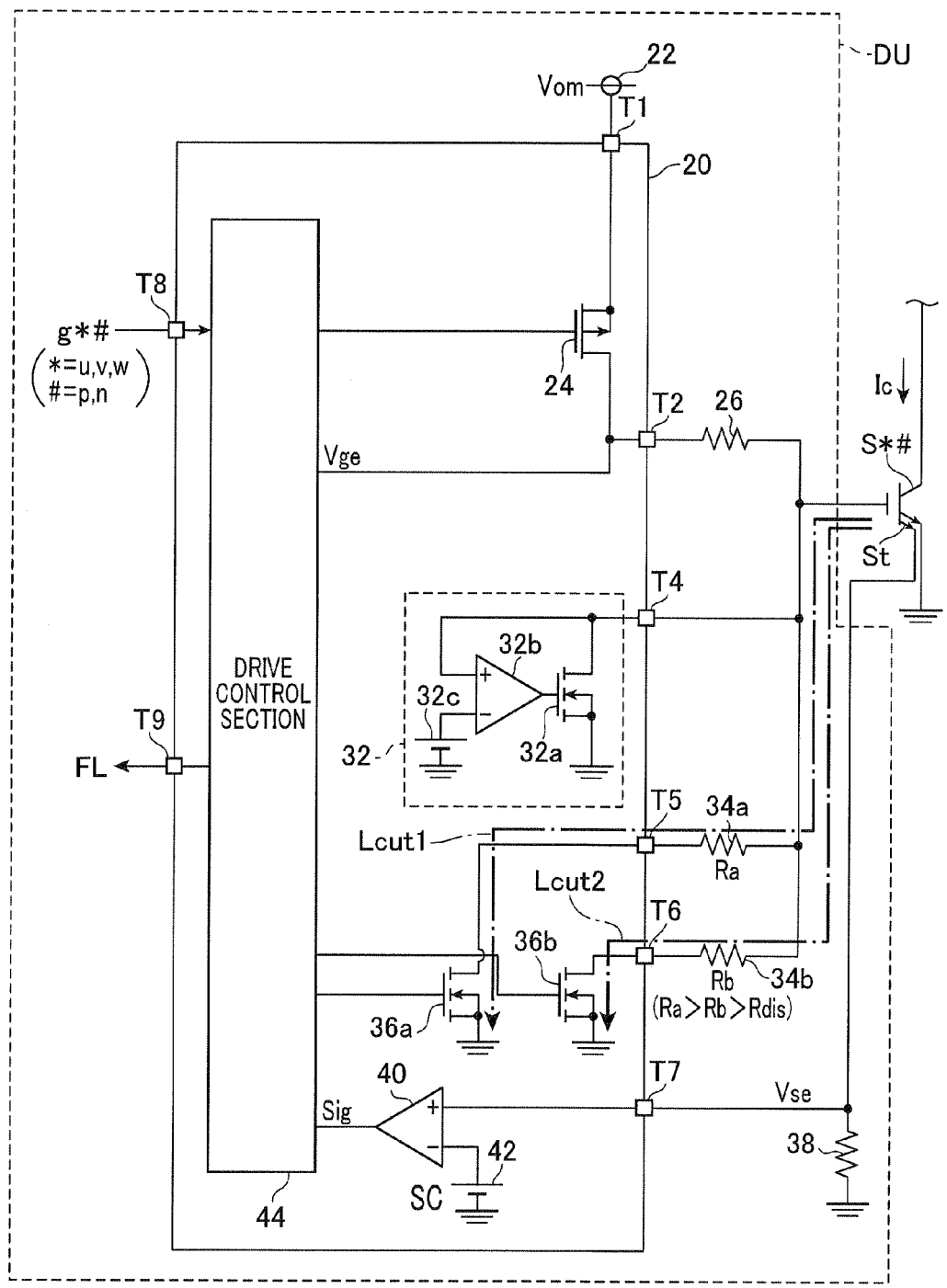
FIG. 9 is a view showing a structure of the drive unit according to a fourth exemplary embodiment of the present invention.

FIG. 9 is a view showing a structure of the drive unit DU according to the fourth exemplary embodiment. The same components of the drive units DU shown in FIG. 9 and FIG. 2 according to the fourth exemplary embodiment and the first exemplary embodiment will be referred by the same reference numbers and characters.

As shown in FIG. 9, the normal operation mode discharging path Ldis, the resistance 28 for discharging and the switching element 30 for discharging are eliminated from the structure of the drive IC 20 in the dive unit DU according to the fourth exemplary embodiment. Furthermore, the terminal T3 of the drive IC 20 is eliminated.

A description will now be given of the charging and discharging process performed by the drive unit DU according to the fourth exemplary embodiment with reference to FIG. 10.

Figure 10:
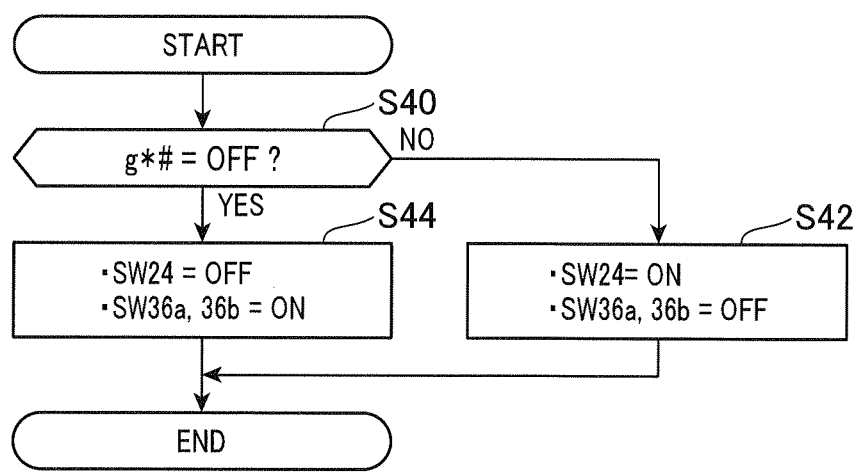
FIG. 10 is a flow chart of a charging and discharging process performed by the drive control section in the drive IC in the drive unit according to the fourth exemplary embodiment of the present invention.

FIG. 10 is a view showing a flow chart of the charging and discharging process performed by the drive control section 44 in the drive IC 20 in the drive unit DU according to the fourth exemplary embodiment.

The drive control section 44 repeatedly performs the charging and discharging process shown in FIG. 10 every predetermined time interval. In the fourth exemplary embodiment, because the drive control section 44 is a hardware device, the logic circuits in the hardware device perform the charging and discharging process shown in FIG. 10.

In the routine in the flow chart shown in FIG. 10, in step S40, the drive control section 44 detects whether or not the operation instruction g*# is a turning-off instruction.

When the judgment result in step S40 indicates negation ("NO" in step S40), the operation flow goes to step S42.

In step S42, the drive control section 44 turns on the switching element 24 for charging, and turns off the first cutoff switching element 36a and the second cutoff switching element 36b in order to perform the charging process.

On the other hand, when the judgment result in step S40 indicates affirmation ("YES" in step S40), the operation flow goes to step S44.

In step S44, the drive control section 44 turns off the switching element 24 for charging, and turns off the first cutoff switching element 36a and the second cutoff switching element 36b in order to perform the discharging process. In the fourth exemplary embodiment, the step S40 corresponds to the discharge operation section used in the claims, which turns on both the first cutoff switching element 36a and the second cutoff switching element 36b in order to turns off the switching element S*# during the normal operation mode, i.e. normal functioning.

After the completion of the process in step S42 and the process in step S44, the drive control section 44 completes the routine in the flow chart shown in FIG. 10.

A description will now be given of the software cutoff process performed by the drive control section 44 in the drive IC 20 in the drive unit DU according to the fourth exemplary embodiment.

The software cutoff process according to the fourth exemplary embodiment can be performed by the same manner shown in FIG. 5. In particular, instead of the step S20 shown in FIG. 5, the drive control section 44 turns on the second cutoff switching element 36b, and turns off the switching element 24 for charging and the first cutoff switching element 36a.

In addition, instead of the process in step S22 shown in FIG. 5, the drive control section 44 turns on the first cutoff switching element 36a, and turns off the switching element 24 for charging and the second cutoff switching element 36b.

The fourth exemplary embodiment can decrease the number of the overall terminals, that is, the terminals to be used for the resistance 28 for discharging, the switching element 30 for discharging, and the drive IC 20. This makes it possible to decrease the manufacturing cost of the drive unit DU while selecting the optimum overcurrent protection process of the switching elements S*# on the basis of the type 1 short circuit in upper and lower arms and the type 2 short circuit in upper and lower arms.

Fifth Exemplary Embodiment

A description will be given of the software cutoff process performed by the drive control section 44 in the drive IC 20 in the drive unit DU according to the fifth exemplary embodiment with reference to FIG. 11.

FIG. 11 is a view showing a flow chart of the software cutoff process performed by the drive control section in the drive IC 20 in the drive unit DU according to a fifth exemplary embodiment.

The same processes between the fifth exemplary embodiment shown in FIG. 11 and the second exemplary embodiment shown in FIG. 7 will be referred with the same reference numbers and characters.

The fifth exemplary embodiment performs the software cutoff process shown in FIG. 11 which is different from the software cutoff process of the second exemplary embodiment shown in FIG. 7. During the software cutoff process according to the fifth exemplary embodiment, the drive control section 44 sets the first cutoff switching element 36a to the completely turned-on state.

The drive control section 44 repeatedly performs the software cutoff process shown in FIG. 11 every predetermined time interval. In the fifth exemplary embodiment, because the drive control section 44 is a hardware device, the logic circuits in the hardware device perform the software cutoff process shown in FIG. 11.

In the routine of the flow chart shown in FIG. 11, when the detection result in step S10 indicates negation ("NO" in step S10), the operation flow goes to step S26. In step S26, the drive control section 44 sets a first time period Tsc1 to the short circuit filter period Tsc.

On the other hand, when the detection result in step S10 indicates affirmation ("YES" in step S10), the operation flow goes to step S28. In step S28, the drive control section 44 sets a second time period Tsc2 to the short circuit filter period Tsc. In particular, the second time period Tsc2 is shorter than the first time period Tsc1.

After the completion of the process in step S26 or step S28, the operation flow goes to step S16.

When the detection result in step S16 indicates affirmation ("YES" in step S16), the operation flow goes to step S30. In step S30, the drive control section 44 turns on the first cutoff switching element 36a, and turns off the switching element 24 for charging and the switching element 30 for discharging. The operation flow goes to step S24.

On the other hand, when the detection result in step S16 indicates negation ("NO" in step S16) or after the completion of the process in step S24, the drive control section 44 completes the software cutoff process shown in FIG. 11.

The software cutoff process according to the fifth exemplary embodiment decreases the short circuit filter period Tsc when the type 2 short circuit in upper and lower arms occurs. Accordingly, when compared with the occurrence of the type 1 short circuit in upper and lower arms, it is possible to shorten a time period counted from the time when the sense voltage Vse exceeds the short circuit threshold value SC to a time when the gate electric charges of the switching element S*# are discharged by the software cutoff process. This makes it possible to decrease the collector current Ic at the time when the gate electric charges of the switching element S*# are discharged by the software cutoff process. Further, this can suppress the magnitude of the surge voltage generated when the switching element S*# is switched to the turned-off state. That is, the software cutoff process performed by the drive control section 44 in the IC20 in the drive unit DU according to the fifth exemplary embodiment can significantly suppress the magnitude of the surge voltage generated when the switching element S*# is switched to the turned-off state.

As previously described, it is accordingly possible for the fifth exemplary embodiment to adjust the short circuit filter period Tsc to an optimum value corresponding to the occurrence of the type 1 short circuit in upper and lower arms and the type 2 short circuit in upper and lower arms. This makes it possible to avoid deterioration of the operational reliability of the switching element S*#.

Other Modifications

The concept of the present invention is not limited by the first to fifth exemplary embodiments previously described. For example, the present invention have the following various modifications.

For example, the processing section, as previously described, increases a resistance value of the electrical paths used by the software cutoff process in order to decrease the discharging speed of discharging the gate electric charges of the switching element S*#. The concept of the present invention is not limited by this. For example, it is possible to use the following cases (A) and (B).

(A) For example, instead of the structure of the drive unit DU according to the second exemplary embodiment shown in FIG. 6, it is possible to have a structure in which an electric power source is connected to an additional switching element (for example, a MOS FET), and the additional switching element is further connected to a connection node between the terminal T5 and the first cutoff switching element 36a. This structure supplies electric charges to the connection node between the terminal T5 and the first cutoff switching element 36a when the switching element S*# is turned on. Accordingly, this structure makes it possible to decrease the discharging speed of the gate electric charges of the switching element S*#. In other words, this structure can prevent the discharge of the gate electric charges of the switching element S*# because the electric power source supplies electric charges to the connection node between the terminal T5 and the first cutoff switching element 36a. In the structure of the case (A) previously described, it is sufficient to adjust a gate voltage of the additional switching element, when the first cutoff switching element 36a is turned on, to a voltage capable of driving the first cutoff switching element 36a in its non-saturated area.

(B) For example, instead of the structure of the drive unit DU according to the second exemplary embodiment shown in FIG. 6, it is possible to have a structure in which an additional switching element (such as a MOS FET) is arranged in order to connect the source terminal of the first cutoff switching element 36a to one selected from the emitter terminal of the switching element S*# and a node (for example, an electric power source for supplying an output voltage) which is higher in voltage potential than the emitter terminal of the switching element S*#. In this structure, it is possible to supply electric power to the additional switching element in order to connect the source terminal of the first cutoff switching element 36a to the node having a high voltage potential. This makes it possible to decrease the discharging speed of the gate electric charges of the switching element S*#.

In the structure of the drive unit DU and the software cutoff process according to the third exemplary embodiment previously described, it is acceptable for the first cutoff path Lcut1 and the second cutoff path Lcut2 to have the same resistance value. It is also acceptable for the first cutoff path Lcut1 to have a resistance value which is lower than a resistance value of the second cutoff path Lcut2.

It is also possible to eliminate the clamping circuit 32 from the drive IC 20 in the drive unit DU according to each of the first to fifth exemplary embodiments. In this structure, the drive control section 44 in the drive IC 20 does not perform the clamping process.

In the structure of the first to fifth exemplary embodiments, the current detection section is comprised of the sense terminal St and the sense resistance 38. However, the concept of the present invention is not limited by this. For example, it is possible to have a voltage detection section (such as a voltage sensor) for detecting a voltage between the collector terminal and the emitter terminal of the switching element S*#. The collector current Ic is determined on the basis of the voltage detected by the voltage sensor.

In the structure of the first to fifth exemplary embodiments, the driver unit DU drives the IGBT as the switching element S*#. However, the concept of the present invention is not limited by this. For example, it is possible to use a MOS FET instead of the IGBT as the switching element S*# to be controlled by the drive unit DU.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalents thereof.

What is claimed is:

1. A drive unit for driving a switching element comprising:
   a current detection section which detects a current flowing in an input terminal and an output terminal of a target switching element to be controlled;
   a turning-off section which forcedly turns off the target switching element when the current detected by the current detection section exceeds a threshold value; and
   a processing section which controls a switching operation performed by the turning-off section for setting the target switching element to the forcedly turned-off state so that a discharging speed in a case B1 is smaller than a discharging speed in a case B2,
   where in the case B1, the turning-off section forcedly turns off the target switching element under the completely turned-on state of the target switching element, and
   in the case B2, the turning-off section forcedly turns off the target switching element under the incompletely turned-on state of the target switching element.

2. The drive unit for driving a switching element according to claim 1 further comprising one or more cutoff paths, which are connected to the open/close control terminal of the target switching element, to be used in a software cutoff process, through which the electric charges of the open/close control terminal of the target switching element are discharged when the turning-off section forcedly turns off the target switching element,
   wherein the processing section increases a resistance value of the cutoff paths in order to decrease the discharging speed of the electric charges of the open/close control terminal of the target switching element.

3. The drive unit for driving a switching element according to claim 2, wherein the cutoff paths to be used for the software cutoff process comprise a first cutoff path and a second cutoff path, and a resistance value of the second cutoff path is smaller than a resistance value of the first cutoff path,
   the turning-off section forcedly turns off the target switching element by using the second cutoff path through which the electric charges of the open/close control terminal of the target switching element are discharged, and
   in order to decrease the discharging speed of the electric charges of the open/close control terminal of the target switching element, the processing section switches from the second cutoff path to the first cutoff path as an electric path through which the electric charges of the open/close control terminal of the target switching element are discharged.

4. The drive unit for driving a switching element according to claim 2, further comprising:
   a cutoff switching element which is arranged on the cutoff path to be used for the software cutoff process and is turned on and off in order to open and close the cutoff path,
   wherein the turning-off section forcedly turns on the cutoff switching element in order to forcedly turn off the target switching element, and
   the processing section increases an on-resistance of the cutoff switching element in order to decrease the discharging speed of the electric charges of the open/close control terminal of the target switching element.

5. The drive unit for driving a switching element according to claim 2, wherein the cutoff paths to be used for the software cutoff process comprise:
   a first cutoff path;
   a second cutoff path;
   a first cutoff switching element is arranged on the first cutoff path in order to open and close the first cutoff path; and
   a second cutoff switching element is arranged on the second cutoff path in order to open and close the first cutoff path,
   wherein the turning-off section turns on the first cutoff switching element and the second cutoff switching element in order to forcedly turn off the target switching element, and
   after both the first cutoff switching element and the second cutoff switching element are turned on, the processing section instructs the turning-off section to forcedly turn off one of the first cutoff switching element and the second cutoff switching element in order to decrease the discharging speed of the electric charges of the open/close control terminal of the target switching element.

6. The drive unit for driving a switching element according to claim 2, wherein the cutoff paths to be used for the software cutoff process comprise:
   a first cutoff path;
   a second cutoff path, a resistance value of the second cutoff path being lower than a resistance value of the first cutoff path;
   a first cutoff switching element arranged on the first cutoff path in order to open and close the first cutoff path; and
   a second cutoff switching element arranged on the second cutoff path in order to open and close the first cutoff path,
   the drive unit further comprises a discharge operation section which turns on both the first cutoff switching element and the second cutoff switching element in order to turn off the target switching element during normal functioning,
   wherein the turning-off section turns off the first cutoff switching element and turns on the second cutoff switching element in order to forcedly turn off the target switching element, and
   the processing section instructs the turning-off section to forcedly turn on the first cutoff switching element and turn off the second cutoff switching element in order to decrease the discharging speed of the electric charges of the open/close control terminal of the target switching element.

7. A drive unit for driving a switching element comprising:
   a current detection section which detects a current flowing in an input terminal and an output terminal of a target switching element to be controlled;
   a turning-off section which forcedly turns off the target switching element when the current detected by the current detection section exceeds the threshold value during a predetermined period of time, and
   a processing section which decreases the predetermined period of time to be used by the turning-off section when the target switching element is in a completely turned-on state so that the decreased predetermined period of time becomes shorter than a predetermined period of time to be used by the turning-off section when the target switching element is in an incompletely turned-on state.

8. The drive unit for driving a switching element according to claim 1, wherein the target switching element is used in an inverter, the inverter comprises a plurality of series connection units, the connection units are connected in parallel to a power source, and each of the series connection units comprises the target switching element in a high voltage side driven by a corresponding drive unit and the target switching element in a low voltage side driven by a corresponding drive unit, and the target switching element in a high voltage site and the target switching element in a low voltage site are connected in series.

9. The drive unit for driving a switching element according to claim 7, wherein the target switching element is used in an inverter, the inverter comprises a plurality of series connection units, the connection units are connected in parallel to a power source, and each of the series connection units comprises the target switching element in a high voltage side driven by a corresponding drive unit and the target switching element in a low voltage side driven by a corresponding drive unit, and the target switching element in a high voltage site and the target switching element in a low voltage site are connected in series.

* * * * *